(12) United States Patent
Kim

(10) Patent No.: US 11,616,510 B2
(45) Date of Patent: Mar. 28, 2023

(54) RAMP VOLTAGE GENERATOR AND IMAGE SENSOR

(71) Applicant: SK hynix Inc., Gyeonggi-do (KR)

(72) Inventor: Eun Jun Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 7 days.

(21) Appl. No.: 17/345,525

(22) Filed: Jun. 11, 2021

(65) Prior Publication Data
US 2022/0173745 A1      Jun. 2, 2022

(30) Foreign Application Priority Data
Nov. 30, 2020   (KR) .................. 10-2020-0163987

(51) Int. Cl.
| | | |
|---|---|---|
| H03M 1/10 | (2006.01) | |
| H03M 1/08 | (2006.01) | |
| H04N 5/3745 | (2011.01) | |
| H03M 1/56 | (2006.01) | |
| H04N 5/378 | (2011.01) | |
| H04N 5/376 | (2011.01) | |

(52) U.S. Cl.
CPC ....... *H03M 1/1009* (2013.01); *H03M 1/0845* (2013.01); *H03M 1/1014* (2013.01); *H03M 1/56* (2013.01); *H04N 5/378* (2013.01); *H04N 5/3745* (2013.01); *H04N 5/3765* (2013.01); *H04N 5/37455* (2013.01)

(58) Field of Classification Search
CPC ............. H03M 1/1009; H03M 1/0845; H03M 1/1014; H03M 1/56; H04N 5/37455; H04N 5/378; H04N 5/3765
USPC .......................................... 341/169
See application file for complete search history.

(56) References Cited

U.S. PATENT DOCUMENTS

| | | | |
|---|---|---|---|
| 9,325,301 B2 * | 4/2016 | Lee | H04N 5/37455 |
| 9,736,408 B2 | 8/2017 | Kim | |
| 10,560,078 B2 * | 2/2020 | Song | H03K 3/353 |
| 2018/0123572 A1 * | 5/2018 | Song | H03K 5/12 |

FOREIGN PATENT DOCUMENTS

KR      10-2018-0089165      8/2018

* cited by examiner

*Primary Examiner* — Khai M Nguyen
(74) *Attorney, Agent, or Firm* — IP & T Group LLP

(57) ABSTRACT

A ramp voltage generator includes: a ramping cell array including a plurality of ramping current cells; a calibration cell array including a plurality of calibration current cells; and a current-voltage converter suitable for converting a current supplied from activated ramping current cells among the ramping current cells and activated calibration current cells among the calibration current cells into a voltage to generate a ramp voltage.

19 Claims, 6 Drawing Sheets

(a)

(b)

(a)

(b)

RAMP VOLTAGE GENERATOR AND IMAGE SENSOR

CROSS-REFERENCE TO RELATED APPLICATIONS

The present application claims priority of Korean Patent Application No. 10-2020-0163987, filed on Nov. 30, 2020, which is incorporated herein by reference in its entirety.

BACKGROUND

1. Field

Various embodiments of the present invention relate to a ramp voltage generator and an image sensor.

2. Description of the Related Art

In order to process signals through a digital system, it is essential to convert an analog signal into a digital signal. An analog-to-digital converter (ADC) is used to convert an analog signal into a digital signal. A CMOS Image Sensor (CIS) converts light into analog electrical signals by using pixels and converts the electrical signals into digital signals. A ramp voltage is used for an analog-to-digital conversion operation of the analog-to-digital converter. When the waveform of the ramp voltage is not accurate, it is difficult to accurately perform an analog-to-digital conversion operation.

SUMMARY

Embodiments of the present invention are directed to a ramp voltage generator capable of generating a ramp voltage of an accurate waveform, and an image sensor including the ramp voltage generator.

In accordance with an embodiment of the present invention, a ramp voltage generator includes: a ramping cell array including a plurality of ramping current cells; a calibration cell array including a plurality of calibration current cells; and a current-voltage converter suitable for converting a current supplied from activated ramping current cells among the ramping current cells and activated calibration current cells among the calibration current cells into a voltage to generate a ramp voltage.

In accordance with another embodiment of the present invention, an image sensor includes: a pixel array suitable for outputting a pixel signal corresponding to incident light; a row decoder suitable for selecting and controlling pixels in the pixel array for each row; a ramp voltage generator suitable for generating a ramp voltage; and an analog-to-digital conversion circuit suitable for analog-to-digital conversion of the pixel signal based on the ramp voltage, wherein the ramp voltage generator includes: a ramping cell array including a plurality of ramping current cells; a calibration cell array including a plurality of calibration current cells; and a current-voltage converter suitable for generating the ramp voltage by converting a current supplied from activated ramping current cells among the ramping current cells and activated calibration current cells among the calibration current cells into a voltage.

In accordance with still another embodiment of the present invention, a converter suitable for generating a ramp voltage from a ramp current and a calibration current during a ramp operation; a ramping circuit suitable for providing the converter with the ramp current according to gain information, the ramp current linearly decreasing from its maximum during the ramp operation; and a calibration circuit suitable for: providing the converter with the calibration current having a preset level at start of the ramp operation, decreasing the calibration current by a predetermined amount according to the gain information during the ramp operation, and adjusting the amount according to power information indicating fluctuation of a power voltage supplied to the generator.

DETAILED DESCRIPTION

Figure 1:
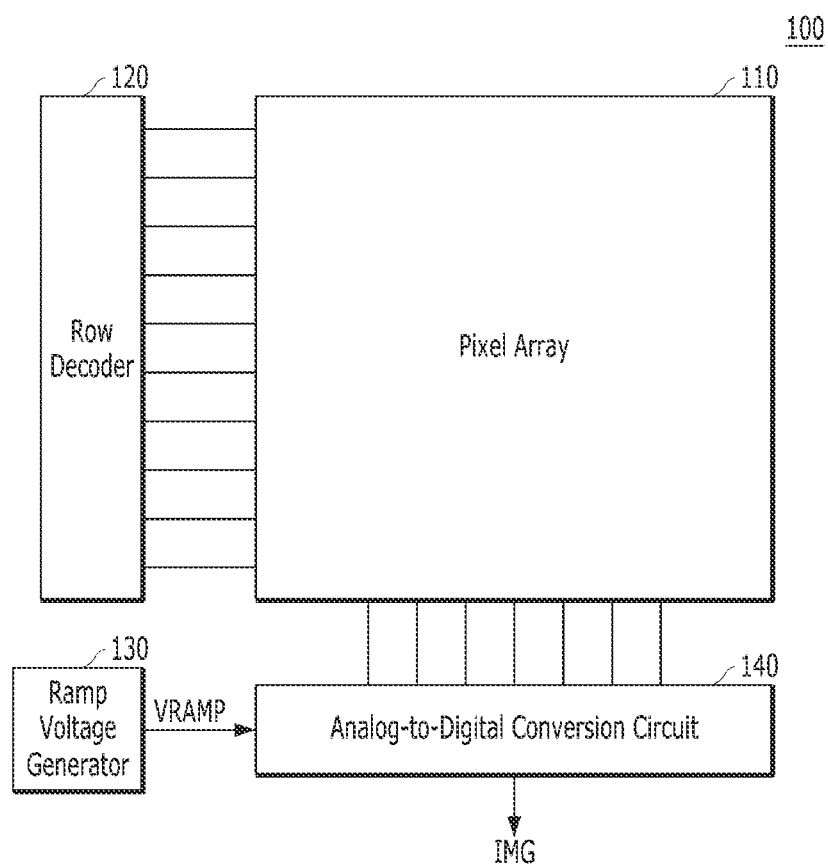
FIG. 1 is a block diagram illustrating an image sensor 100 in accordance with an embodiment of the present invention.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a block diagram illustrating an image sensor 100 in accordance with an embodiment of the present invention.

Referring to FIG. 1, the image sensor 100 may include a pixel array 110, a row decoder 120, a ramp voltage generator 130, and an analog-to-digital conversion circuit 140.

The pixel array 110 may include a plurality of pixels that are formed in an array of a plurality of rows and a plurality of columns. The pixels may output a pixel signal out of the sensed light.

The row decoder 120 may control operations of the pixel array 110 by selecting pixels of each row line in the pixel array 110. Under the control of the row decoder 120, pixels of one row may output pixel signals to the analog-to-digital conversion circuit 140 at a time.

The ramp voltage generator 130 may generate a ramp voltage VRAMP. The ramp voltage VRAMP may be a voltage used for an analog-to-digital conversion operation of the analog-to-digital conversion circuit 140. During a ramping operation, the ramp voltage VRAMP may linearly drop in an ideal case to accurate perform an analog-to-digital conversion operation.

Based on the ramp voltage VRAMP, the analog-to-digital conversion circuit 140 may perform an analog-to-digital conversion operation on the pixel signals output from the pixel array. The result of converting the pixel signals into digital signals may be output as an image IMG. The analog-to-digital conversion circuit 140 may perform an analog-to-digital conversion operation on the pixel signals of multiple columns in parallel. The analog-to-digital conversion circuit 140 may perform an analog-to-digital conversion operation by starting to count a digital code from a moment when the ramp voltage VRAMP begins to fall and stopping the counting at a moment when the ramp voltage VRAMP and the voltage of the pixel signals become to have the same level.

Figure 2:
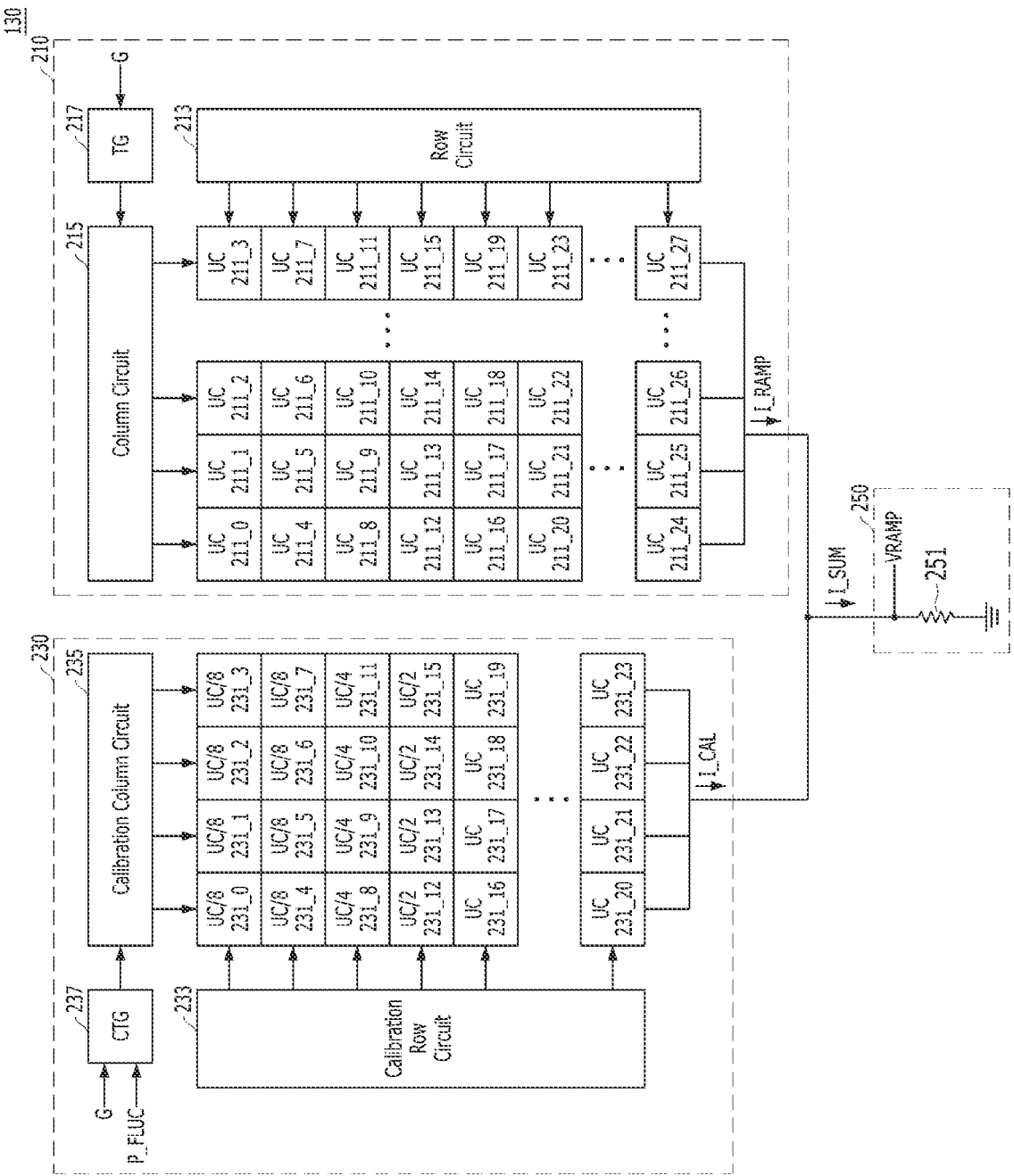
FIG. 2 is a block diagram illustrating a ramp voltage generator 130 shown in FIG. 1.

FIG. 2 is a block diagram illustrating the ramp voltage generator 130 shown in FIG. 1.

Referring to FIG. 2, the ramp voltage generator 130 may include a ramping cell array 210, a calibration cell array 230, and a current-voltage converter 250.

The ramping cell array 210 may supply, to the current-voltage converter 250, a current for generating a ramp voltage that falls at a predetermined or set slope during a ramping operation. The ramping cell array 210 may include a plurality of ramping current cells 211_0 to 211_27, a row circuit 213, a column circuit 215, and a timing generator 217. The row circuit 213 may control activation of the ramping current cells 211_0 to 211_27 in a row direction under the control of the timing generator 217. Also, the column circuit 215 may control activation of the ramping current cells 211_0 to 211_27 in a column direction under the control of the timing generator 217. As a result, the number of activated current cells among the ramping current cells 211_0 to 211_27 may be determined by the operation of the row circuit 213 and the column circuit 215. All of the activated current cells among the ramping current cells 211_0 to 211_27 may output the same unit current. Output currents of the activated current cells among the ramping current cells 211_0 to 211_27 may be summed up and transferred to the current-voltage converter 250. This current is denoted by I_RAMP in FIG. 2.

In the ramping cell array 210, all ramping current cells 211_0 to 211_27 may be activated before a ramping operation, and then, when the ramping operation begins, the number of activated ramping current cells may be sequentially decreased. The extent of the sequential decrease may vary depending on the gain of the analog-to-digital conversion circuit 140. For example, when the gain is x1 and the ramping operation starts, the number of the activated ramping current cells may be decreased by two per clock. When the gain is x2 and the ramping operation starts, the number of the activated ramping current cells may be decreased by one per clock. Also, when the current amounts of the ramping current cells of the ramping cell array 210 are different, the number of the activated current cells having a large current amount per clock may be reduced in a case that the gain is x1, and the number of the activated current cells having a small current amount per clock may be reduced in a case that the gain is x2. The slope at which the ramp voltage VRAMP falls during a ramping operation may vary depending on the gain. In other words, when the gain is x2, the ramp voltage VRAMP may decrease at a slope of half of that when the gain is x1. Gain information G may be input to the timing generator 217.

As the gain of the analog-to-digital conversion circuit 140 increases, that is, as the absolute value of the slope of the ramp voltage VRAMP decreases, the time until the voltage level of the ramp voltage VRAMP becomes equal to the voltage level of the pixel signal may increase. Thus, the value of the digital code counted by the analog-to-digital conversion circuit 140 may increase. In other words, the gain of the image sensor 100 may be increased. Also, as the gain of the analog-to-digital conversion circuit 140 becomes decreased, that is, as the absolute value of the slope of the ramp voltage increases, the time until the voltage level of the ramp voltage becomes equal to the voltage level of the pixel signal may decrease. The value of the digital code counted by the digital conversion circuit 140 may decrease. In short, the gain of the image sensor 100 may be decreased.

The calibration cell array 230 may supply, to the current-voltage converter 250, a current for correcting the ramp voltage VRAMP to have linearity. The calibration cell array 230 may include a plurality of calibration current cells 231_0 to 231_23, a calibration row circuit 233, a calibration column circuit 235, and a calibration timing generator 237. The calibration row circuit 233 may control activation of the calibration current cells 231_0 to 231_23 in the row direction under the control of the calibration timing generator 237. Also, the calibration column circuit 235 may control activation of the calibration current cells 231_0 to 231_23 in the column direction under the control of the calibration timing generator 237. As a result, the number of the activated current cells among the calibration current cells 231_0 to 231_23 may be determined by the operation of the calibration row circuit 233 and the calibration column circuit 235. Output currents of the activated current cells among the calibration current cells 231_0 to 231_23 may be summed up and transferred to the current-voltage converter 250. This current is denoted by I_CAL in FIG. 2.

Since the calibration cell array 230 is for correcting the ramp voltage VRAMP to have linearity, some calibration current cells 231_16 to 231_23 of the calibration current cells 231_0 to 231_23 may output a unit current, and some calibration current cells 231_12 to 231_15 may output a unit current/2, and some calibration current cells 231_8 to 231_11 may output a unit current/4, and some calibration current cells 231_0 to 231_7 may output a unit current/8. Since the calibration current cells 231_0 to 231_23 have various output current values, the current I_CAL output from the calibration cell array 230 may be adjusted delicately.

The calibration timing generator 237 may adjust the amount of output current of the calibration cell array 230 based on the correction information. The correction information may include gain information G and power information P_FLUC. Although the correction information is illustrated herein to include the gain information G and the power information P_FLUC, the correction information may include more information needed to correct the level of the ramp voltage. How the calibration timing generator 237 adjusts the output current amount I_CAL of the calibration cell array 230 based on the correction information will be described in detail later with reference to FIG. 4.

The current-voltage converter 250 may convert the total current I_SUM obtained by summing the output current I_RAMP of the ramping cell array 210 and the output current I_CAL of the calibration cell array 230 into a voltage and output it as a ramp voltage VRAMP. The current-voltage converter 250 may generate a ramp voltage VRAMP, which is a voltage corresponding to an IR drop at a resistor 251 by flowing the sum current I_SUM through the resistor 251. Therefore, the voltage level of the ramp voltage VRAMP may be proportional to the current amount of the total current I_SUM.

Figure 3A:
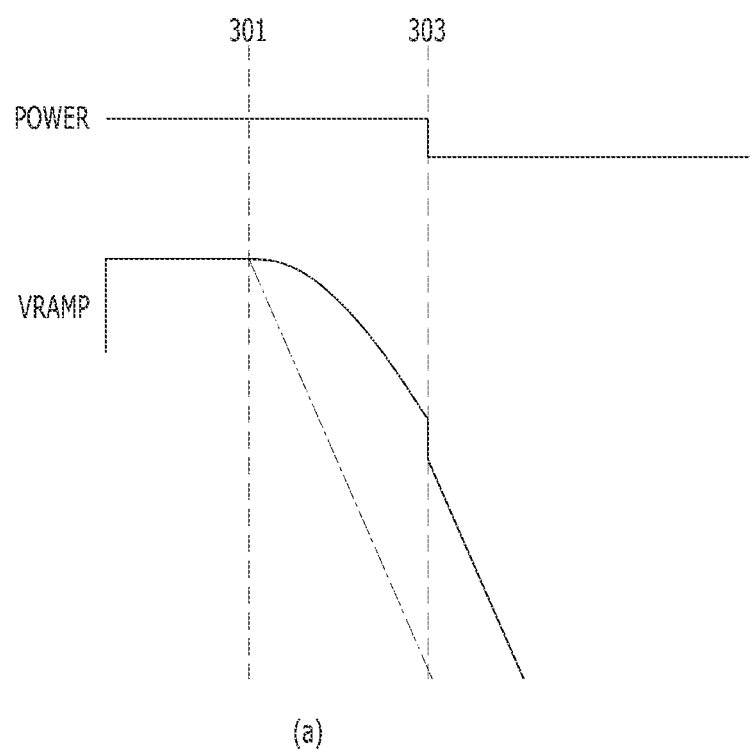
FIGS. 3A and 3B are diagrams illustrating a ramp voltage VRAMP generated by the ramp voltage generator 130 shown in FIG. 2.
Figure 3B:
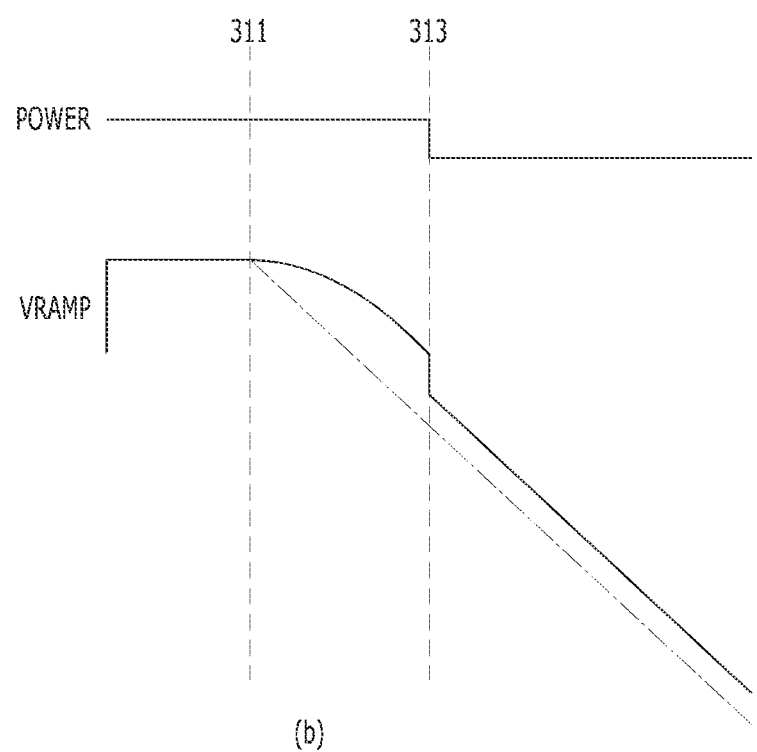

FIGS. 3A and 3B are diagrams illustrating the ramp voltage VRAMP generated by the ramp voltage generator 130 shown in FIG. 2. In FIGS. 3A and 3B, it is assumed that the calibration cell array 230 does not perform a correction operation in the ramp voltage generator 130. In other words, it is assumed that the output current I_CAL of the calibration cell array 230 is constant.

FIG. 3A is a diagram showing a ramping operation of the ramp voltage VRAMP when the gain is x1.

Referring to FIG. 3A, a ramping operation in which the level of the ramp voltage VRAMP starts to fall at a moment 301 may be started. The dotted line may represent the level of the ideal ramp voltage VRAMP corresponding to the current I_SUM, and the solid line may represent the level of the actual ramp voltage VRAMP. At the moment 301, distortion occurs in which the level of the ramp voltage VRAMP slowly decreases differently from the dotted line, which is caused by loading at the output terminal of the ramp voltage VRAMP. If there is no loading, the ramp voltage VRAMP may fall linearly like the dotted line. However, since there actually is a considerable amount of loading at the ramp voltage output terminal, the actual ramp voltage VRAMP does not fall like the dotted line of the ramp voltage VRAMP and falls like the solid line.

In a moment 303, fluctuation of the power source POWER in which the power source POWER falls may occur. Here, the power source POWER may mean a power source voltage that is supplied to the ramp voltage generator 130. When the power source POWER falls, the ramp voltage VRAMP generated based on the power source POWER may also decrease in the same manner.

In other words, referring to FIG. 3A, it may be seen that the ramp voltage does not linearly fall due to the loading of the ramp voltage output terminal and the fluctuation of the power source, which causes the distortion in the descending curve of the ramp voltage.

FIG. 3B is a diagram illustrating a ramping operation of the ramp voltage VRAMP when the gain is x2.

Referring to FIG. 3B, a ramping operation in which the level of the ramp voltage VRAMP starts to fall at a moment 311 may start. The dotted line may represent the level of the ideal ramp voltage VRAMP corresponding to the current I_SUM, and the solid line may represent the level of the actual ramp voltage VRAMP. Since FIG. 3B shows a case where the gain is x2, it may be seen that the slope of the dotted line in FIG. 3B is half the slope of the dotted line in FIG. 3A. At the moment 311, distortion may occur in which the level of the ramp voltage VRAMP decreases slowly differently from the dotted line, which is caused by the loading at the ramp voltage VRAMP output terminal. If there is no loading, the ramp voltage VRAMP may drop linearly as shown in the dotted line. However, since there actually is a considerable amount of loading in the ramp voltage output terminal, the actual ramp voltage VRAMP may not fall as shown in the dotted line and the ramp voltage VRAMP may fall as shown in the solid line. When the ramp voltage VRAMP has a relatively small descending slope because the gain is x2, the distortion caused by the loading of the ramp voltage output terminal may appear less than when the gain is x1.

At a moment 313, fluctuation of the power source POWER in which the power source POWER falls may occur. When the power source POWER falls, the ramp voltage VRAMP generated based on the power source POWER may also fall. It may be seen that the magnitude of the fluctuation of the ramp voltage VRAMP caused by the fluctuation of the power source POWER may be the same in FIGS. 3A and 3B regardless of the gains.

Figure 4A:
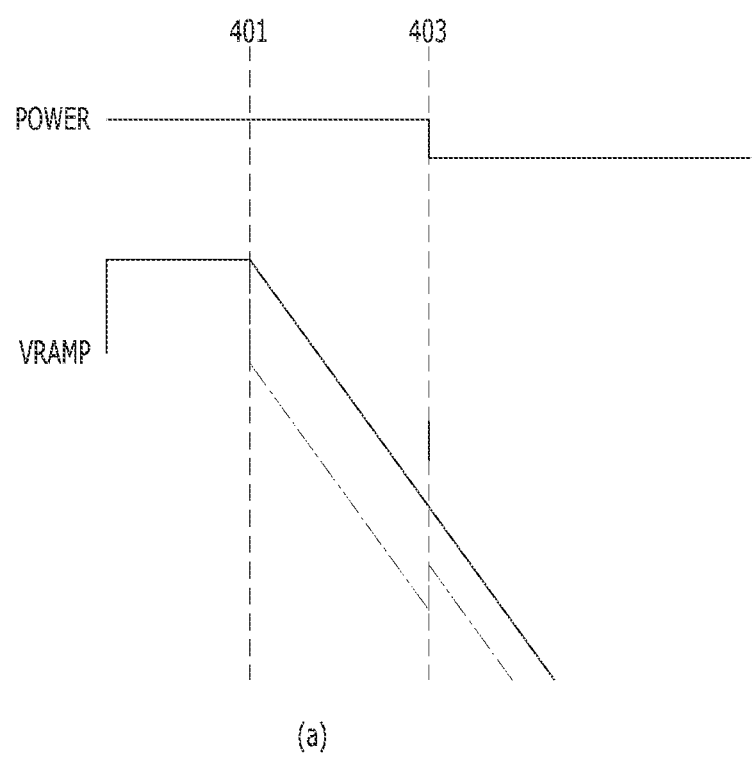
FIGS. 4A and 4B are diagrams illustrating a ramp voltage VRAMP generated by the ramp voltage generator 130 shown in FIG. 2.
Figure 4B:
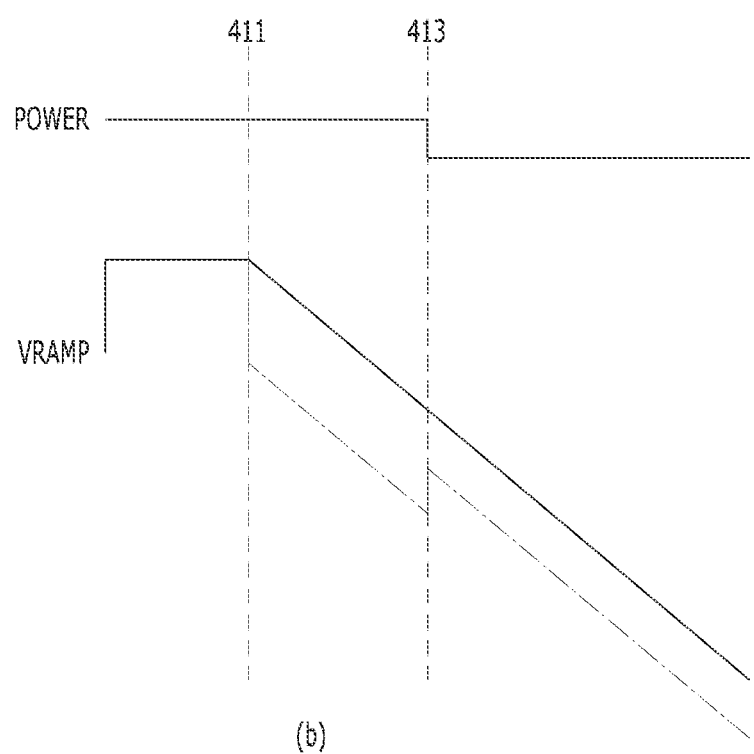

FIGS. 4A and 4B are diagrams illustrating the ramp voltage VRAMP generated by the ramp voltage generator 130 shown in FIG. 2. In FIGS. 4A and 4B, it is assumed that the calibration cell array 230 performs a correction operation in the ramp voltage generator 130.

FIG. 4A is a diagram illustrating a ramping operation of the ramp voltage VRAMP when the gain is x1.

Referring to FIG. 4A, before a moment 401, the output current I_RAMP of the ramping cell array 210 may be maintained at a maximum value, and the output voltage I_CAL of the calibration cell array 230 may be maintained at a preset value. Here, the preset value may be about a half of the maximum current value that may be output by the calibration cell array 230.

At the moment 401, the output current I_CAL of the calibration cell array 230 may be reduced. For example, the output current I_CAL of the calibration cell array 230 may be reduced by an amount corresponding to 10 times of the unit current. The amount by which the output current I_CAL of the calibration cell array 230 decreases at the moment 401 may be referred to as a correction current. The dotted line may represent the ideal level of the ramp voltage VRAMP corresponding to the current I_SUM. It may be seen that at the moment 401, the output current I_CAL of the calibration cell array 230 decreases by the amount of the correction current so that the dotted line falls at the moment 401. The solid line may represent the actual level of the ramp voltage VRAMP, and it may be seen that the solid line falls linearly after the moment 401 as the loading of the ramp voltage output terminal is compensated by the decrease of the output current I_SUM by the amount of the correction current at the moment 401. The correction operation in which the calibration cell array 230 decreases the output current I_CAL by the amount of the correction current may last until the end of the ramping operation in which the ramp voltage VRAMP descends.

At a moment 403, fluctuation of the power source POWER may occur in which the power source POWER descends. The power information P_FLUC indicating the fluctuation of the power source may be provided from a circuit such as a power source detection circuit (not shown) in a system including the image sensor 100. In order to compensate for the descending of the power source POWER, the calibration cell array 230 may increase the level of the output current I_CAL. For example, the calibration cell array 230 may increase the level of the output current I_CAL by an amount corresponding to 2.5 times of the unit current at the moment 403. The change of the dotted line at the moment 403 may show the increase. The solid line representing the actual ramp voltage VRAMP based on the increase of the output current I_CAL at the moment 403 may linearly descend without being affected by the fluctuation of the power source POWER. When fluctuation where the power source POWER ascends occurs at the moment 403, the calibration cell array 230 may decrease the level of the output current I_CAL. Also, the amount of the output current I_CAL increased or decreased by the calibration cell array 230 may vary depending on the extent of the fluctuation of the power source POWER.

FIG. 4B is a diagram illustrating a ramping operation of the ramp voltage VRAMP when the gain is x2.

Referring to FIG. 4B, before the moment 411, the output current I_RAMP of the ramping cell array 210 may be maintained at a maximum value, and the output voltage I_CAL of the calibration cell array 230 may be maintained at a preset value.

At the moment 411, the output current I_CAL of the calibration cell array 230 may be decreased. For example, the output current I_CAL of the calibration cell array 230 may be decreased by an amount corresponding to 7 times of the unit current. The amount of the output current I_CAL that is decreased in the calibration cell array 230 at the moment 411 may be referred to as a correction current. In FIG. 4A, the amount of the correction current corresponds to 10 times of the unit current. In FIG. 4B, the amount of the correction current corresponds to 7 times of the unit current. This difference of the correction current is because the influence of the loading of the ramp voltage output terminal on the ramp voltage VRAMP depends on the gain of the analog-to-digital conversion circuit 140. The amount of the correction current should increase as the gain becomes smaller. The dotted line may represent the ideal level of the ramp voltage VRAMP corresponding to the current I_SUM, and it may be seen from the decrease of the output current I_CAL in the calibration cell array 230 by the amount of the correction current at the moment 411 that the dotted line descends at the moment 411. The solid line may represent the actual level of the ramp voltage VRAMP, and it may be seen that the solid line linearly falls after the moment 411 as the loading of the ramp voltage output terminal is compensated by the descending of the output current I_SUM by the amount of the correction current at the moment 411. The correction operation in which the calibration cell array 230 decreases the output current I_CAL by the amount of the correction current may last until the end of the ramping operation in which the ramp voltage VRAMP descends.

At a moment 413, fluctuation of the power source POWER in which the power source POWER descends may occur. In order to compensate for the descending of the power source POWER, the calibration cell array 230 may increase the level of the output current I_CAL. For example, the calibration cell array 230 may increase the level of the output current I_CAL by an amount of 2.5 times of the unit current at the moment 403. The change of the dotted line at the moment 403 may represent the increase. As the output current I_CAL increases at the moment 403, the solid line representing the actual ramp voltage VRAMP may fall linearly without being affected by the fluctuation of the power source POWER. Since the fluctuation of the ramp voltage VRAMP due to the fluctuation of the power source POWER is not related to the gain, the amount of the output current I_CAL adjusted at the moment 401 of FIG. 4A and the amount of the output current I_CAL adjusted at the moment 411 may be the same.

Referring to FIGS. 4A and 4B, it may be seen that the ramp voltage VRAMP falls linearly by the operation of the calibration cell array 230 correcting the amount of the output current I_CAL according to the situation. When the ramp voltage VRAMP linearly falls, the analog-to-digital conversion circuit 140 may perform an accurate analog-to-digital conversion operation.

According to the embodiment of the present invention, a ramp voltage having an accurate waveform may be generated.

While the present invention has been described with respect to the specific embodiments, it will be apparent to those skilled in the art that various changes and modifications may be made without departing from the spirit and scope of the invention as defined in the following claims.

What is claimed is:

1. A ramp voltage generator, comprising:
    a ramping cell array including a plurality of ramping current cells;
    a calibration cell array including a plurality of calibration current cells; and
    a current-voltage converter suitable for converting a current supplied from activated ramping current cells among the ramping current cells and activated calibration current cells among the calibration current cells into a voltage to generate a ramp voltage,
    wherein each of the ramping current cells is suitable for supplying a unit current of the same amount when activated, and
    wherein at least one among the calibration current cells is suitable for supplying a current whose amount is less than the unit current when activated.

2. The ramp voltage generator of claim 1,
    wherein the calibration current cells include:
    current cells each suitable for supplying a current of (the unit current/8) when activated;
    current cells each suitable for supplying a current of (the unit current/4) when activated;
    current cells each suitable for supplying a current of (the unit current/2) when activated; and
    current cells each suitable for supplying the unit current when activated.

3. The ramp voltage generator of claim 1, wherein the ramping cell array further includes:
    a row circuit suitable for controlling activation of the ramping current cells, which are arranged in a plurality of rows and a plurality of columns, in a row direction;
    a column circuit suitable for controlling activation of the ramping current cells in a column direction; and
    a timing generator suitable for controlling the row circuit and the column circuit.

4. The ramp voltage generator of claim 1, wherein the calibration cell array further includes a calibration current control circuit suitable for selecting the calibration current cells that are activated in the calibration cell array in response to correction information.

5. The ramp voltage generator of claim 4, wherein the correction information includes information on a gain of a device including the ramp voltage generator.

6. The ramp voltage generator of claim 4, wherein the correction information includes information on a level of the power source voltage supplied to the ramp voltage generator.

7. The ramp voltage generator of claim 4, wherein the current control circuit includes:
    a calibration row circuit suitable for controlling activation of the calibration current cells, which are arranged in a plurality of rows and a plurality of columns, in a row direction;
    a calibration column circuit suitable for controlling activation of the ramping current cells in a column direction; and
    a calibration timing generator suitable for controlling the calibration row circuit and the calibration column circuit.

8. A ramp voltage generator, comprising:
    a ramping cell array including a plurality of ramping current cells;
    a calibration cell array including a plurality of calibration current cells; and
    a current-voltage converter suitable for converting a current supplied from activated ramping current cells among the ramping current cells and activated calibration current cells among the calibration current cells into a voltage to generate a ramp voltage,
    wherein the calibration cell array is suitable for supplying a preset current to the current-voltage converter before a ramping operation in which the ramp voltage starts to fall, and suitable for supplying a current of [the preset current-a correction current] to the current-voltage converter after the ramping operation starts.

9. The ramp voltage generator of claim 8, wherein the calibration cell array is further suitable for increasing an amount of the correction current as an absolute value of a slope of the ramp voltage increases during the ramping operation.

10. The ramp voltage generator of claim 8, wherein the calibration cell array is further suitable for increasing an amount of the correction current as a gain of a device including the ramp voltage generator decreases.

11. The ramp voltage generator of claim 8, wherein when fluctuation of a power source voltage supplied to the ramp voltage generator is detected during the ramping operation, the calibration cell array is further suitable for adjusting an amount of current supplied to the current-voltage converter.

12. The ramp voltage generator of claim 11, wherein when a decrease of the power source voltage is detected during the ramping operation, the calibration cell array increases the amount of current supplied to the current-voltage converter.

13. The ramp voltage generator of claim 11, wherein when an increase of the power source voltage is detected during the ramping operation, the calibration cell array decreases the amount of current supplied to the current-voltage converter.

14. The ramp voltage generator of claim 8, wherein the ramping cell array is suitable for supplying a maximum current to the current-voltage converter before the ramping operation, and suitable for decreasing an amount of current supplied to the current-voltage converter after the ramping operation starts.

15. An image sensor, comprising:
a pixel array suitable for outputting a pixel signal corresponding to incident light;
a row decoder suitable for selecting and controlling pixels in the pixel array for each row;
a ramp voltage generator suitable for generating a ramp voltage; and
an analog-to-digital conversion circuit suitable for analog-to-digital conversion of the pixel signal based on the ramp voltage,
wherein the ramp voltage generator includes:
a ramping cell array including a plurality of ramping current cells;
a calibration cell array including a plurality of calibration current cells; and
a current-voltage converter suitable for generating the ramp voltage by converting a current supplied from activated ramping current cells among the ramping current cells and activated calibration current cells among the calibration current cells into a voltage,
wherein each of the ramping current cells is suitable for supplying a unit current of the same amount when activated, and
wherein at least one among the calibration current cells is suitable for supplying a current whose amount is less than the unit current when activated.

16. An image sensor, comprising:
a pixel array suitable for outputting a pixel signal corresponding to incident light;
a row decoder suitable for selecting and controlling pixels in the pixel array for each row;
a ramp voltage generator suitable for generating a ramp voltage; and
an analog-to-digital conversion circuit suitable for analog-to-digital conversion of the pixel signal based on the ramp voltage,
wherein the ramp voltage generator includes:
a ramping cell array including a plurality of ramping current cells;
a calibration cell array including a plurality of calibration current cells; and
a current-voltage converter suitable for generating the ramp voltage by converting a current supplied from activated ramping current cells among the ramping current cells and activated calibration current cells among the calibration current cells into a voltage,
wherein the calibration cell array is suitable for supplying a preset current to the current-voltage converter before a ramping operation in which the ramp voltage starts to fall, and suitable for supplying a current of [the preset current-a correction current] to the current-voltage converter after the ramping operation starts.

17. The image sensor of claim 16, wherein the calibration cell array is further suitable for increasing an amount of the correction current as a gain of the analog-to-digital conversion circuit decreases.

18. The image sensor of claim 16, wherein when fluctuation of a power source voltage supplied to the ramp voltage generator is detected during the ramping operation, the calibration cell array is further suitable for adjusting an amount of current supplied to the current-voltage converter.

19. A ramp voltage generator comprising:
a converter suitable for generating a ramp voltage from a ramp current and a calibration current during a ramp operation;
a ramping circuit suitable for providing the converter with the ramp current according to gain information, the ramp current linearly decreasing from its maximum during the ramp operation; and
a calibration circuit suitable for:
providing the converter with the calibration current having a preset level at start of the ramp operation,
decreasing the calibration current by a predetermined amount according to the gain information during the ramp operation, and
adjusting the amount according to power information indicating fluctuation of a power voltage supplied to the generator.

* * * * *